United States Patent
Daubert et al.

(10) Patent No.: US 11,303,257 B2
(45) Date of Patent: Apr. 12, 2022

(54) CURRENT SENSOR INTEGRATED CIRCUIT WITH COMMON MODE VOLTAGE REJECTION

(71) Applicant: Allegro MicroSystems, LLC, Manchester, NH (US)

(72) Inventors: Steven Daubert, Bedford, NH (US); David J. Haas, Concord, NH (US); Craig S. Petrie, Merrimack, NH (US); Milan Valenta, Hostivice (CZ); Roman Prochazka, Struharov (CZ); Richard Stary, Dolni Brezany (CZ); Sina Haji Alizad, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 604 days.

(21) Appl. No.: 16/365,855

(22) Filed: Mar. 27, 2019

(65) Prior Publication Data

US 2020/0313637 A1 Oct. 1, 2020

(51) Int. Cl.
| | | |
|---|---|---|
| *H03F 3/45* | (2006.01) | |
| *G01R 19/00* | (2006.01) | |
| *G05F 1/625* | (2006.01) | |
| *G01R 31/36* | (2020.01) | |

(52) U.S. Cl.
CPC ..... *H03F 3/45968* (2013.01); *G01R 19/0092* (2013.01); *G05F 1/625* (2013.01)

(58) Field of Classification Search
CPC ........... H03F 3/45968; G01R 19/0092; G01R 15/146; G01R 19/0053; G05F 1/625
USPC ......................................... 330/252–261, 307
See application file for complete search history.

(56) References Cited

U.S. PATENT DOCUMENTS

| | | |
|---|---|---|
| 5,537,650 A | 7/1996 | West et al. |
| 6,091,987 A | 7/2000 | Thompson |
| 7,602,386 B2 | 10/2009 | Maekawa |
| 9,203,339 B2 | 12/2015 | Sato |
| 9,214,884 B2 | 12/2015 | Sonoda et al. |
| 9,318,481 B1 | 4/2016 | Wang et al. |
| 9,347,998 B2 | 5/2016 | Szczeszynski |
| 9,929,683 B2 | 3/2018 | Sonoda et al. |
| 9,935,452 B2 | 4/2018 | Looby et al. |
| 10,003,306 B1 | 6/2018 | Larson et al. |
| 10,084,407 B2 | 9/2018 | Looby et al. |
| 2003/0080772 A1* | 5/2003 | Giacomini .......... B60R 16/0239 324/765.01 |

(Continued)

OTHER PUBLICATIONS

Notice of Allowance dated May 20, 2020 for U.S. Appl. No. 16/511,104; 8 pages.

(Continued)

*Primary Examiner* — Hieu P Nguyen
(74) *Attorney, Agent, or Firm* — Daly, Crowley, Mofford & Durkee, LLP

(57) ABSTRACT

A current sensor integrated circuit to sense a current through a resistor includes a substrate, a tub disposed in the substrate, an analog front end disposed in the tub and comprising an amplifier having inputs coupled across the resistor and a charging circuit configured to bias the analog front end and the tub to a bias voltage that is a predetermined offset voltage greater than a common mode voltage associated with the resistor. In embodiments, the analog front end is biased to a first bias voltage and the tub is biased to a second, different bias voltage.

22 Claims, 7 Drawing Sheets

(56) References Cited

U.S. PATENT DOCUMENTS

| | | |
|---|---|---|
| 2008/0018769 A1 | 1/2008 | Hatano et al. |
| 2018/0367073 A1 | 12/2018 | Haas |
| 2020/0021212 A1 | 1/2020 | Yamada et al. |
| 2020/0028456 A1 | 1/2020 | Morioka et al. |

OTHER PUBLICATIONS

U.S. Appl. No. 16/511,104, filed Jul. 15, 2019, Petrie, et al.

Allegro MicroSystems, LLC A4910—Data Sheet, Rev. 2, "Automotive 3-Phase MOSFET Driver"; Jan. 24, 2013; www.allegromicrosysterns.com; 36 pages.

Analog Devices "16-Bit, Isolated Sigma-Delta Modulator", AD7403-EP, © 2016 Analog Devices, Inc., www.analog.com; Initial Version, Apr. 2016, 12 pages.

Kanekawa et al., "An Analog Front-End with On-Chip Isolator for V.90 56kbps Modems", 0-7803-5809-0/00, © 2000 IEEE 2000 Custom Integrated Circuits Conference; 4 pages.

ON Semiconductor®, NCS201R Data Sheet; "Current-Shunt Monitors, Voltage Output, Bidirectional Zero-Drift, Low- or High-Side Current Sensing"; Jul. 2018, Rev. 7, Publication Order No. NCS210R/D; http://www.onsemi.com/pub/Collateral/NCS201R.PDF; 20 pages.

Linear Technology, LTC2947 Data Sheet, "30A Power/Energy Monitor with Integrated Sense Resistor"; https://www.analog.com/media/en.technical-documentation/datasheets/2947fa.pdf; dated Feb. 2017, Rev. A, www.linearcom/LTC2947, © Linear Technology Corporation 2016; 44 pages.

Texas Instruments, INA260 Data Sheet, "Precision Digital Current and Power Monitor with Low-Drift, Precision Integrated Shunt"; http://www.ti.com/lit/ds/symlink/ina260.pdf; SBOS656C—Jul. 2016—Revised Dec. 2016; 38 pages.

L. Xu et al., "A±4A High-Side Current Sensor with 25V Input CM Range and 0.9% Gain Error from −40° C. to 85° C. Using an Analog Temperature Compensation Technique", ISSCC 2018, Session 19, Sensors and Interfaces, 19.4, 2018 IEEE International Solid-State Circuits Conference, 978-1-5090-4940-0/18 Feb. 2018; 3 pages.

L. Xu et al., "A 110db SNR ADC with ±30V Input Common-Mode Range and 8μV Offset for Current Sensing Applications", ISSCC 2015, Session 5, Analog Techniques, 5.2, 2015 IEEE International Solid-State Circuits Conference, 978-1-4799-6224-2/15, © 2015, Feb. 2015; 3 pages.

Q. Fan et al., A Capacity Coupled Chopper Instrumentation Amplifier with a ±30V Common-Mode Range, 160 dB CMRR and 5μV Offset, ISSCC 2012, Session 21, Analog Techniques, 21.9, 978-1-4673-0377-4/12, © 2012, Feb. 2012; 3 pages.

* cited by examiner

CURRENT SENSOR INTEGRATED CIRCUIT WITH COMMON MODE VOLTAGE REJECTION

CROSS-REFERENCE TO RELATED APPLICATIONS

Not Applicable.

STATEMENT REGARDING FEDERALLY SPONSORED RESEARCH

Not Applicable.

FIELD

This disclosure relates generally to current sensor integrated circuits (ICs) and more particularly such ICs including common mode voltage rejection circuitry and techniques.

BACKGROUND

Current sensor integrated circuits (ICs) are used in a wide variety of applications including motors, in which current through one or more motor windings is measured by measuring a voltage across a sense resistor coupled in series or "in-line" with the motor winding. Such current sensor ICs generate an analog or digital output signal indicative of the motor phase current as may be used in controlling motor position and speed.

In-line current sensing in a motor application and other applications can be complicated by relatively large common mode voltages experienced by the sense resistor and thus also by the circuitry coupled to detect the current through the sense resistor. For example, the voltage across the sense resistor can swing between ground and a high input supply voltage level. Further, because of the inductive nature of motor windings, the resistor voltage can in fact swing beyond the supply voltage range.

Various techniques are used to electrically isolate sense circuitry from sensed elements subjected to large common mode voltages. For example, in some arrangements, a multi-chip solution entails the use of multiple integrated circuits to isolate the sense circuitry from large common mode voltages.

SUMMARY

The present disclosure provides a current sensor integrated circuit and associated methods for biasing regions of the integrated circuit containing the sensing circuitry to a predetermined offset voltage greater than the common mode voltage. The described circuitry and methods can improve the accuracy of the resulting current sensing by rejecting the common mode voltage.

In one aspect, a current sensor integrated circuit includes a substrate, a tub disposed in the substrate, an analog front end disposed in the tub and including an amplifier having inputs coupled across a resistor, and a charging circuit configured to bias the analog front end and the tub to a bias voltage that is a predetermined offset voltage greater than a common mode voltage associated with the resistor.

The current sensor may include one or more of the following features. The common mode voltage associated with the resistor may be coupled to the analog front end and to the tub as a reference potential. The analog front end may further include a regulator configured to power the amplifier and coupled to receive the bias voltage as a regulator supply input voltage. The current sensor integrated circuit may further include a boot capacitor having a first terminal coupled to the charging circuit and to the regulator to provide the regulator supply input voltage and a second terminal coupled to the regulator to provide a reference potential to the regulator. The charging circuit may include a plurality of switches configured to selectively couple a fly capacitor to a charge pump voltage during a first clock phase and to decouple the fly capacitor from the charge pump voltage and couple the fly capacitor to the boot capacitor during a second clock phase. The predetermined offset voltage can be selected to prevent forward biasing of a junction between the tub and the substrate.

The charging circuit may include a first charging circuit portion configured to bias the analog front end to a first bias voltage that is a first predetermined offset voltage greater than the common mode voltage associated with the resistor and a second charging circuit portion configured to bias the tub to a second bias voltage that is a second predetermined offset voltage greater than the common mode voltage associated with the resistor, wherein the second predetermined offset voltage is different than the first predetermined offset voltage. The second predetermined offset voltage can be selected to prevent forward biasing of a junction between the tub and the substrate. The current sensor integrated circuit may further include a tub boot capacitor having a first terminal coupled to the second charging circuit portion and to the tub and a second terminal coupled to a p-well region disposed in the tub. The second charging circuit portion may include a plurality of switches configured to selectively couple a fly capacitor to a charge pump voltage during a first clock phase and to decouple the fly capacitor from the charge pump voltage and couple the fly capacitor to the tub boot capacitor during a second clock phase.

The substrate can be a semiconductor substrate comprised of a p-type material and the tub is an epitaxial tub comprised of an n-type material. The analog front end may further include an analog-to-digital converter coupled to an output of the amplifier to generate a digital signal having a value indicative of the current through the resistor. The current sensor integrated circuit may further include an output isolator coupled between the analog-to-digital converter and a digital processor, wherein the digital processor is configured to generate a sensor output signal indicative of the current through the resistor. The current sensor integrated circuit may further include an input isolator coupled between the digital processor and the analog front end and configured to transmit a clock signal from the digital processor to the analog front end for synchronization and use by the analog-to-digital converter.

According to a further aspect, a method of sensing a current through a resistor with a current sensor integrated circuit includes providing a substrate, forming an analog front end of the current sensor in a tub disposed in the substrate, wherein the analog front end includes an amplifier, amplifying, with the amplifier, a differential voltage across the resistor, and biasing the analog front end and the tub to a bias voltage that is a predetermined offset voltage greater than a common mode voltage associated with the resistor.

The method may include one or more of the following features. Forming the analog front end may include providing a regulator coupled to receive the bias voltage as a supply input voltage. Biasing the analog front end may include charging a fly capacitor to a charge pump voltage during a first clock phase and decoupling the fly capacitor from the charge pump voltage and coupling the fly capacitor to a boot capacitor coupled to the analog front end and the tub during a second clock phase.

Biasing the analog front end and the tub may include biasing the analog front end to a first bias voltage that is a first predetermined offset voltage greater than the common mode voltage associated with the resistor and biasing the tub to a second bias voltage that is a second predetermined offset voltage greater than the common mode voltage associated with the resistor, wherein the second predetermined offset voltage is different than the first predetermined offset voltage. The second predetermined offset voltage may be selected to prevent forward biasing of a junction between the tub and the substrate. Biasing the tub may include charging a fly capacitor to a charge pump voltage during a first clock phase and decoupling the fly capacitor from the charge pump voltage and coupling the fly capacitor to a tub boot capacitor coupled to the tub during a second clock phase.

Also described is a current sensor integrated circuit including a substrate, a tub disposed in the substrate, an analog front end disposed in the tub and including an amplifier having inputs coupled across the resistor and means for biasing the analog front end and the tub to a bias voltage that is a predetermined offset voltage greater than a common mode voltage associated with the resistor. The biasing means may include first biasing means for biasing the analog front end to a first bias voltage that is a first predetermined offset voltage greater than the common mode voltage associated with the resistor and second biasing means for biasing the tub to a second bias voltage that is a second predetermined offset voltage greater than the common mode voltage associated with the resistor, wherein the second predetermined offset voltage is different than the first predetermined offset voltage.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
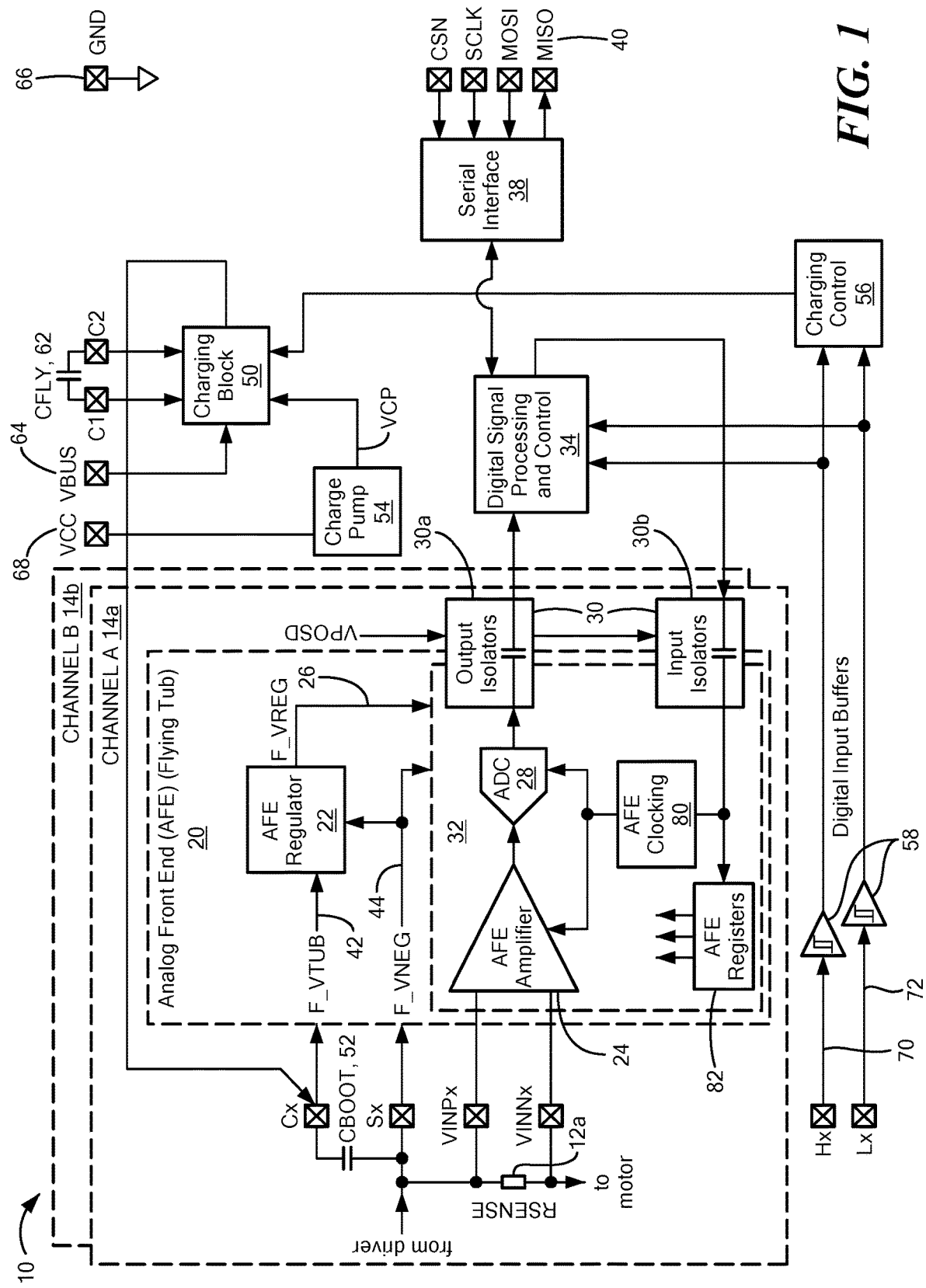
FIG. 1 is a block diagram of a current sensor IC including an analog front end and tub biased to achieve common mode rejection.

Referring to FIG. 1, a current sensor integrated circuit (IC) 10 is coupled to a resistor 12a to sense a current through the resistor. The current sensor 10 has an analog front end 20 that includes a signal path 32 and a regulator 22. The signal path 32 includes an amplifier 24 having inputs coupled across the sense resistor 12a and an analog-to-digital converter (ADC) 28 coupled to an output of the amplifier 24 to generate a digital signal having a value indicative of the voltage across, and thus also the current through, the resistor 12a.

Digital portions of the current sensor IC 10, including a digital processor 34, are coupled to the analog front end 20 through level-translating isolators 30 including output and input isolators 30a, 30b, respectively. Isolators 30 permit bidirectional communication between the analog front end 20 and low voltage digital circuitry. The isolators 30 can take various forms, including but not limited to differential capacitive isolators.

An analog front end (AFE) clock circuit 80 and AFE registers 82 form part of the analog front end 20 and are responsive to a clock signal from the digital processor 34. With this arrangement, the analog front end clock is synchronized with the processor clock. Registers 82 can store configuration bits as may be used for various functions such as trimming a reference voltage.

Digital processor 34 is configured to generate one or more signals indicative of the current through the resistor 12a. An interface 38 is coupled to the digital processor 34 and operates to generate one or more sensor output signals 40 in a desired format, including but not limited to a SPI format, a SENT format, or an VC format, for communication of the sensed current to external circuits and systems. Depending on the format, additional signal lines can include inputs to the interface 38, as shown for the example SPI interface.

In some applications for the current sensor IC 10, the sense resistor 12a can experience significant common mode voltages. For example, referring also to the example motor control system application shown in FIG. 2, the resistor 12a can be coupled in series with a motor winding and current sensor IC 10 can be thus, configured to sense a motor phase current. More particularly, a motor control system 200 includes a motor 204 as may be a three-phase brushless motor as one example, containing a plurality of windings, each coupled to a driver 208. In this example, two of three motor windings are coupled to the driver 208 through a respective sense resistor 12a, 12b. The sense resistors 12a, 12b can be coupled to the current sensor IC 10 (FIG. 1) for sensing the respective phase current. To this end, the current sensor IC 10 may include multiple channels (e.g., channel A 14a and channel B 14b in FIG. 1), each having connections VINPx, VINNx coupled across a respective sense resistor 12a, 12b, as shown for sense resistor 12a in FIG. 1. Output signals 40 of the current sensor IC 10 can be coupled to a motor controller 220 that is configured to generate motor control signals Hx 70', Lx 72'.

More particularly, driver 208 includes pairs of switches coupled in parallel between a supply voltage VBUS 216 and ground 218. In some automotive applications, the supply voltage VBUS 216 can have a nominal value of +48V.

Nodes SA, SB, and SC between each pair of driver switches are coupled to an end of a respective motor coil. The illustrated switches are provided in the form of FETs, each having a gate terminal coupled to receive a control signal from motor control circuit 220, which turns the switches on and off in a preordered sequence in order to selectively couple and decouple each motor winding to and from supply voltage VBUS 216 and ground 218. In this way, motor control circuit 220 provides power to the motor 204. For example, driver switches 210, 212 are coupled together at node SA, which node is coupled to sense resistor 12a. In the context of FIG. 1, node SA is represented by IC connection Sx. The control signals for switches 210, 212 are labeled Hx 70', Lx 72', respectively.

Figure 2:
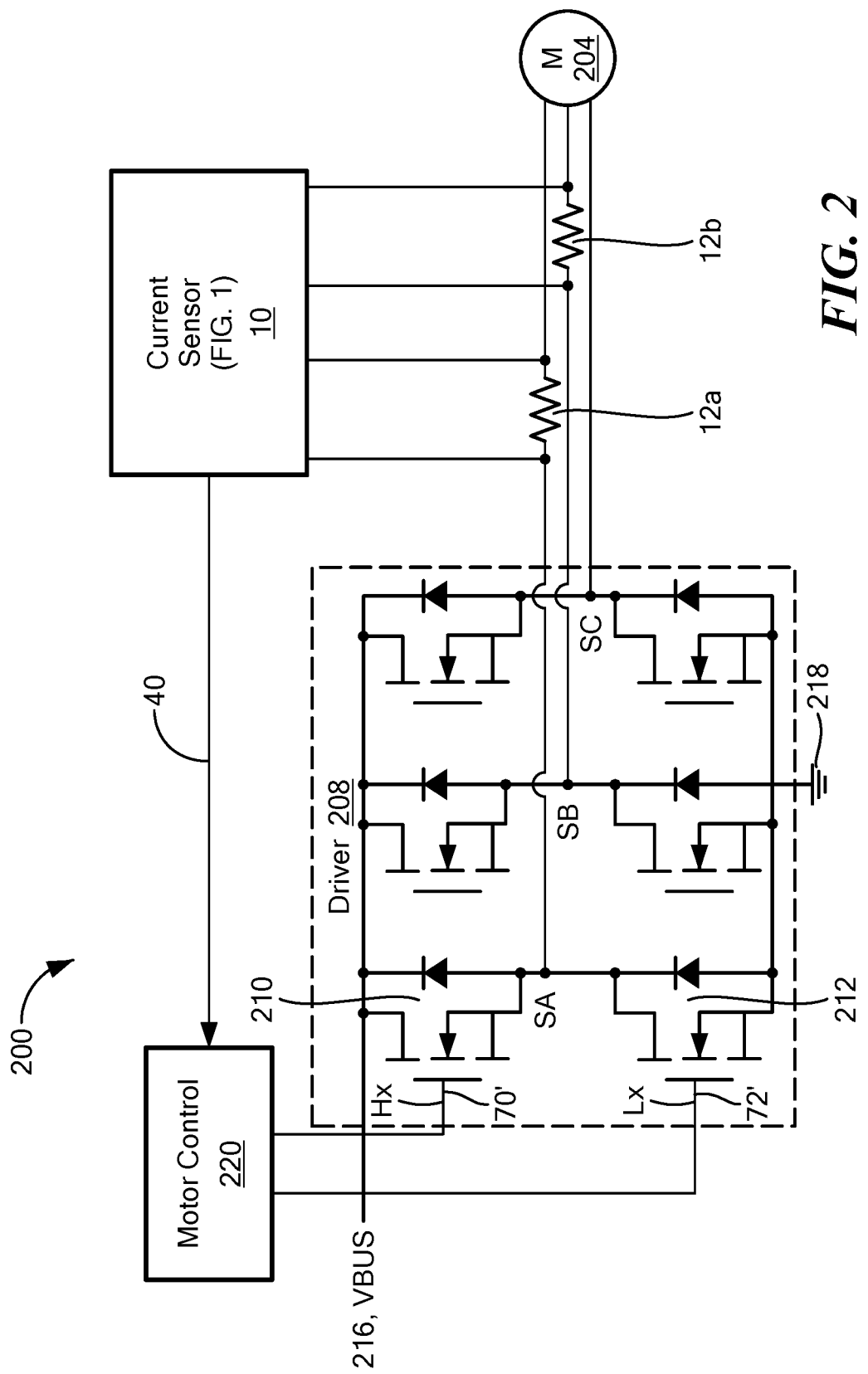
FIG. 2 is a block diagram of an example motor system application for the current sensor IC of FIG. 1.

In the example application of FIG. 2, the common mode voltage associated with each sense resistor 12a, 12b nominally can swing between VBUS 216 and ground 218. However, because of the inductive nature of the motor windings and the rapid transitions of the driver control signals, some undershoot and overshoot can occur. In this arrangement in which the sense resistor's common mode voltage is driven through a large dynamic range, the resistor can be described as "flying" and the common mode voltage range can extend beyond the rails of the IC (i.e., extend beyond the range between the nominal IC supply voltage VCC 68 and ground 218). In an example embodiment in which the VBUS voltage 216 is nominally +48V, the voltage at the sense resistors 12a, 12b can swing from as high as +80V to as low as −16V. Sensing the current through the sense resistors 12a, 12b is complicated by the fact that the differential voltage across the resistors can be on the order of millivolts.

Referring again to FIG. 1, in order to reject the common mode voltage associated with the sense resistor 12a, according to an aspect of the disclosure, the analog front end 20 is biased to a bias voltage F_VTUB 42 that is a predetermined offset voltage greater than a common mode voltage associated with the resistor. For example, the bias voltage F_VTUB 42 can be the first predetermined offset voltage greater than an externally driven common mode voltage as seen at IC connection Sx (referred to herein as common mode voltage Sx).

The current sensor IC 10 receives a supply voltage VCC 68 and can have a reference, or ground connection 66 (that can be the same as the ground connection 218 in the motor system application of FIG. 2). The system voltage VBUS 64 (that can be the same as VBUS 216 in the motor system application of FIG. 2) can provide a reference voltage for the sensor IC 10. The current sensor IC 10 can further receive control signals Hx 70, Lx 72 (as may be the same as or similar to the signals Hx 70', Lx 72' provided by the motor controller 220 to control driver switches 210, 212, respectively, in the motor system application of FIG. 2) for use in generating the bias voltage F_VTUB 42 as will be explained. The signals Hx 70, Lx 72 can be logically equivalent to motor control signals Hx 70', Lx 72' but may have different voltage levels. For example, the motor control signals Hx 70', Lx 72' may be amplified and level-shifted versions of control signals Hx 70, Lx 72 (FIG. 1) to permit the motor driver FETs to be properly turned on and off.

The analog front end 20 includes a regulator 22 coupled to an IC connection Cx to receive the bias voltage F_VTUB 42 as a positive supply voltage input and to IC connection Sx (which is the externally driven resistor common mode voltage) to receive a F_VNEG reference voltage 44 as a negative supply voltage input. The regulator 22 is configured to generate a regulated voltage F_VREG 26 to power the amplifier 24 and other circuitry of the signal path 32. In one example embodiment, the nominal regulated voltage F_VREG 26 can be 3.3 volts. With this arrangement, the amplifier 24 is powered by the F_VREG voltage 26 referenced to the negative supply voltage input F_VNEG 44 (which F_VNEG voltage 44 is also the resistor common mode voltage at connection Sx), thereby rejecting common mode voltage in the differential measurement of the voltage across the resistor 12a.

Figure 3:
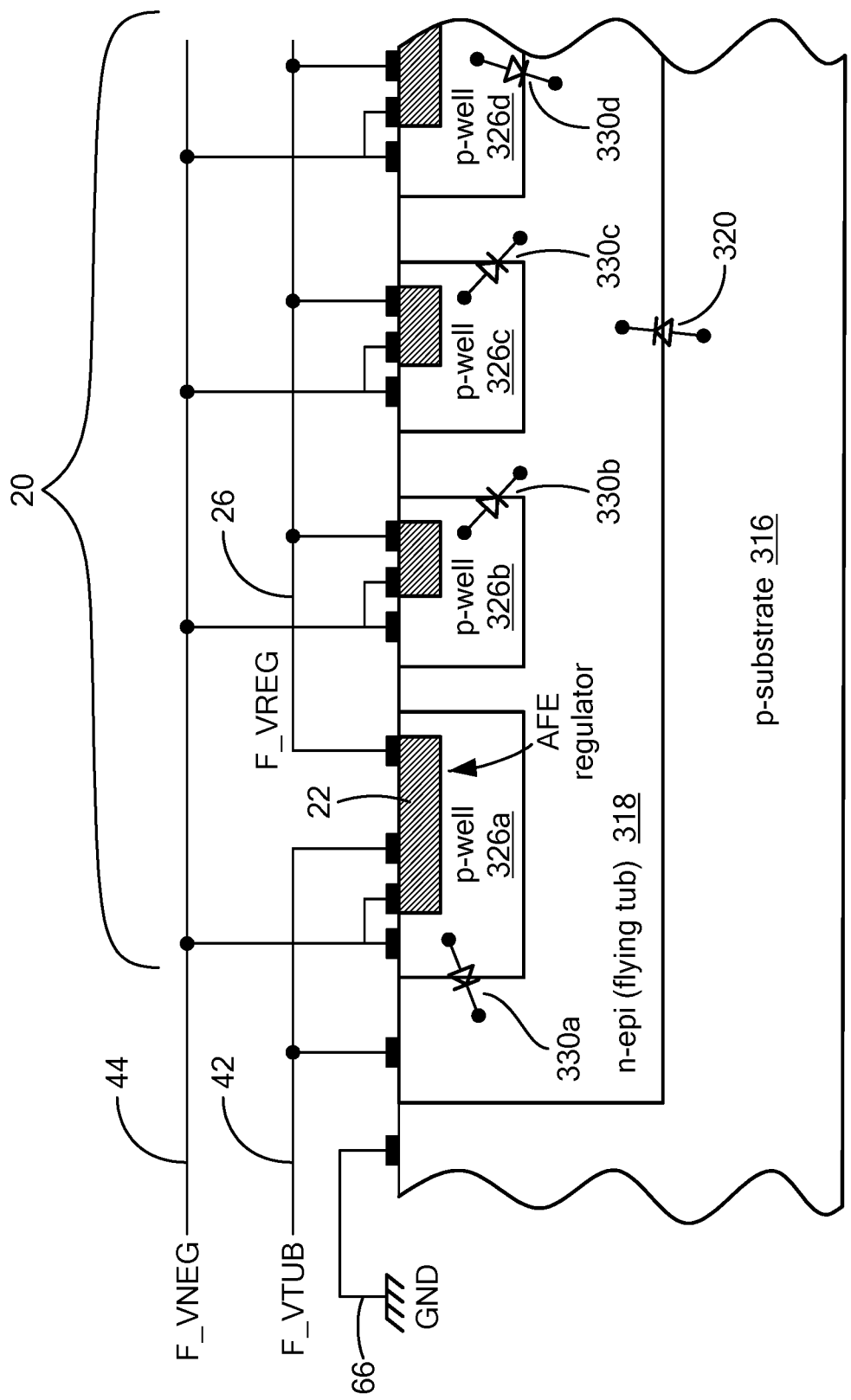
FIG. 3 is a simplified cross-sectional view of the current sensor of FIG. 1.
Figure 5:
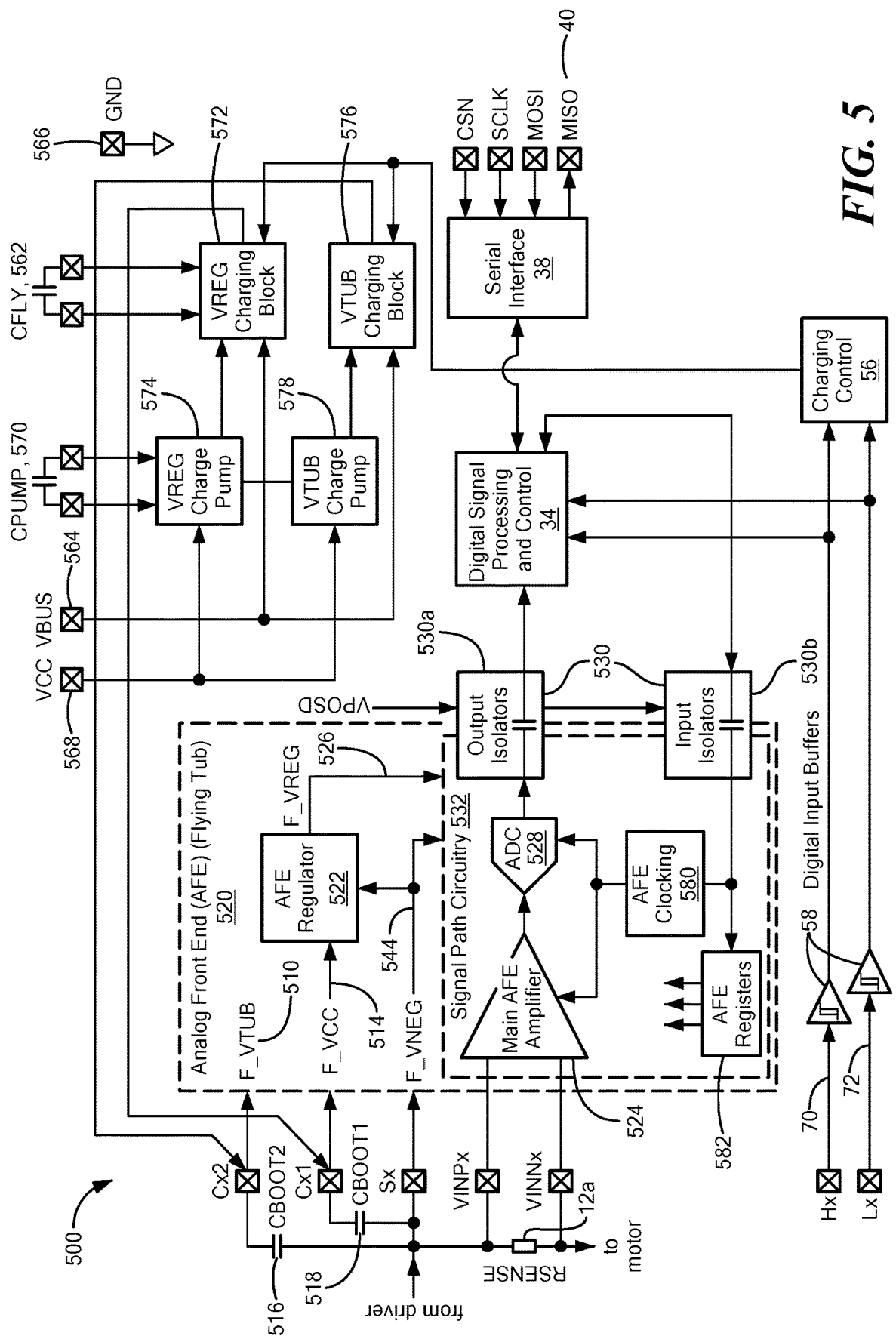
FIG. 5 is a block diagram of a current sensor IC including an analog front end and a tub biased to different voltages.

Referring also to the simplified cross-sectional view of the current sensor IC in FIG. 3, the current sensor IC 10 can include a substrate 316 and a tub 318 disposed in the substrate, with the analog front end 20 disposed in the tub. In the current sensor IC 10 of FIG. 1, both the analog front end 20 and the tub 318 are biased to the bias voltage F_VTUB 42. It will be appreciated that tub 318 need not be a single tub, but rather, can be split into more than one tub which tubs may be biased to the same voltage. In order to provide voltage isolation between the commonly biased analog front end 20 and tub 318 and the low voltage circuitry supported by the substrate, in some embodiments, the bias voltage F_VTUB 42 can be on the order of +15V greater than the common mode voltage Sx in order to prevent forward biasing of the junction 320 between the tub and substrate. In the embodiment of FIG. 5, the analog front end 20 and the tub 318 are biased to different bias voltages as will be explained.

The analog front end circuitry 20 is formed in p-well regions 326a-326d in the tub 318. More particularly, regulator 22 can be formed in p-well region 326a and additional active front end circuitry can be constructed in p-type regions 326b, 326c, 326d, as shown.

The substrate 316 can be a semiconductor substrate or wafer, as may be comprised of a p-type material. The tub 318 can be formed by an epitaxial process and can be an n-type material. It will be appreciated that other processes and/or materials may be possible.

A junction (i.e., a p-n silicon junction) 320 between the substrate 316 and tub 318 is pictorially represented by a diode that forms an isolation barrier (i.e., an open circuit) when the n-side is biased higher than the p-side. Additional p-n junctions 330a, 330b, 330c, 330d are shown between the p-type regions 326a, 326b, 326c, 326d and the tub 318, respectively.

Substrate 316 is coupled to ground 66 (FIG. 1). The tub 318 is coupled to the bias voltage F_VTUB 42 and the regulator 22 is coupled to receive the bias voltage F_VTUB 42 referenced to negative supply voltage F_VNEG 44, as shown. P-well regions 326a-326d are coupled to reference voltage F_VNEG 44 and front end circuitry within p-well regions 326b-326d is coupled to receive the regulated voltage F_VREG 26 referenced to reference voltage F_VNEG 44, as shown.

By biasing the tub 318 to a potential that prevents the junction 320 from becoming forward biased (i.e., to a potential approximately 16V higher than the substrate 316), an isolation barrier between the analog front end 20 and the substrate 316 is achieved even when the voltage at sense resistor 12a is below ground, as is desirable to protect the circuitry within the substrate 316 from the high voltages experienced by the biased tub 318. The tub 318 biased in this manner can be referred to as an isolation tub.

Furthermore, by biasing the p-well regions 326a-326d to reference voltage F_VNEG 44, a reverse bias is provided across their junctions 330a-330d with the n-epi tub 318 that is biased to F_VTUB 42. In this way, another isolation layer or barrier is formed between the analog front end 20 and the substrate 316. More particularly, while the 16V bias F_VTUB 42 is a large enough potential to maintain the isolation at junction 320 during the undershoots that can occur during the commutation of the motor, it may be too large a voltage for many of the devices used in the AFE 20 (e.g., some such devices may have a maximum voltage between terminals of 6.5V or even 3.5V). These lower voltage AFE devices are contained in p-wells 326b, 326c, 326d and thus, see a maximum voltage of F_VREG-F_VNEG.

Referring again to FIG. 1, to generate the bias voltage F_VTUB 42, the current sensor IC 10 can include a charging circuit or block 50, a charge pump 54 that boosts an IC supply voltage VCC 68 to a charge pump voltage VCP, a charge control circuit or block 56, digital buffers 58, a fly capacitor CFLY 62, and a boot capacitor CBOOT 52, all coupled as shown. The bias voltage F_VTUB 42 can be generated across the boot capacitor 52 such that the boot capacitor has a first terminal (at which the bias voltage F_VTUB 42 is provided) coupled to the charging circuit 50 and to the analog front end 20 and tub (at connection Cx) and a second terminal coupled to provide the reference potential F_VNEG 44 to the analog front end and tub (at connection Sx). It will be appreciated that while the charge pump 54 is not shown to be connected to an external capacitor, it is possible that one or more capacitors external to the IC 10 may be necessary depending on the voltage and current demands placed on the generated bias voltage F_VTUB 42 in the particular application.

As will be explained further in connection with FIGS. 4A-4C below, the charging circuit 50 can include switches configured to selectively couple the fly capacitor CFLY 62 to a supply voltage (e.g., charge pump voltage VCP generated by charge pump 54) during a first clock phase and to decouple the fly capacitor 62 from the supply voltage and couple the fly capacitor to the boot capacitor 52 during a second clock phase. In some embodiments, the first clock phase does not overlap with the second clock phase. When the fly capacitor 62 is being charged in the first clock phase, the boot capacitor 52 continues to supply power to the analog front end 20. Thus, the boot capacitor 52 is selected to be large enough to supply power to the analog front end 20 without a large voltage droop between the refresh cycles. With this arrangement, the fly capacitor 62 is charged during the first clock phase and charge is transferred from the fly capacitor 62 to the boot capacitor 52 during the second clock phase.

It will be appreciated that the control signals for controlling the switches of the charging circuit 50 can be generated in various ways. For example, the control signals Hx, Lx can be externally generated, can be user programmable, preset, and/or derived from internal circuitry which monitors the voltage at Sx. In some embodiments, as explained in connection with FIGS. 4-4C, the control signals Hx 70, Lx 72 can be application specific signals selected for use based on the expected common mode voltage Sx. More particularly, and as will become apparent, by using the motor control signals Hx 70, Lx 72 to control the charging circuit 50, charging modes are established based on the common mode voltage, as is desirable in order to maintain the desired voltage across the boot capacitor 52 so as to maximize the resulting common mode voltage rejection.

Figure 4:
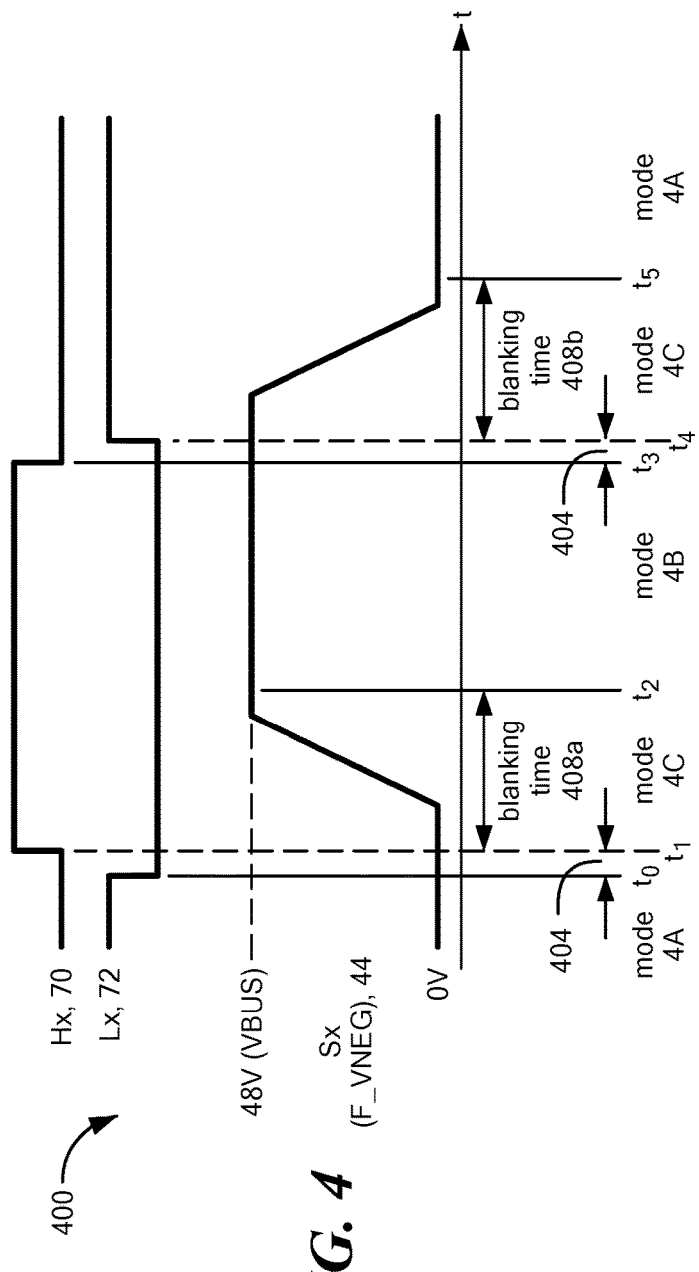
FIG. 4 is a graph showing a common mode voltage waveform in relation to example control signals Lx and Hx associated with the current sensor of FIG. 1.

Referring to FIG. 4, operation of the charging circuit 50 will be explained in connection with example waveforms 400, including an example common mode voltage waveform Sx (which common mode voltage provides the bias reference potential of F_VNEG 44) and control signals Hx 70, Lx 72 by which the common mode voltage Sx is generated. By control of signals Hx 70, Lx 72, motor driver switches (e.g., switches 210, 212 of FIG. 2) cause the voltage at node Sx (e.g., node SA of FIG. 2) to have the relative shape and timing shown by example waveform of the reference voltage F_VNEG 44 in FIG. 4.

Control signals Hx 70, Lx 72 are coupled to the charging control circuit 56 through buffers 58, which charging control circuit 56 generates control signals for switches of the charging circuit 50 based on the state of motor control signals Hx 70, Lx 72. To this end, the charging control circuit 56 can include logic gates for example, in order to generate switch control signals according to the charging scheme explained in connection with FIGS. 4A-4C. Selective opening and closing of switches within the charging circuit 50 cause the fly capacitor 62 and boot capacitor 52 to be coupled in different configurations based on the state of the motor switches (e.g., switches 210, 212 of FIG. 2), which motor switch state is indicated by states of the motor control signals Hx 70, Lx 72.

As is apparent, control signals Hx, Lx are complementary in the sense that when one is high, the other is low and there is dead time 404 when both control signals are low. This is typical of motor driver control signals to ensure that there is no time during which paired high and low side switches are both on (e.g., switches 210, 212 of FIG. 2).

Figure 4A:
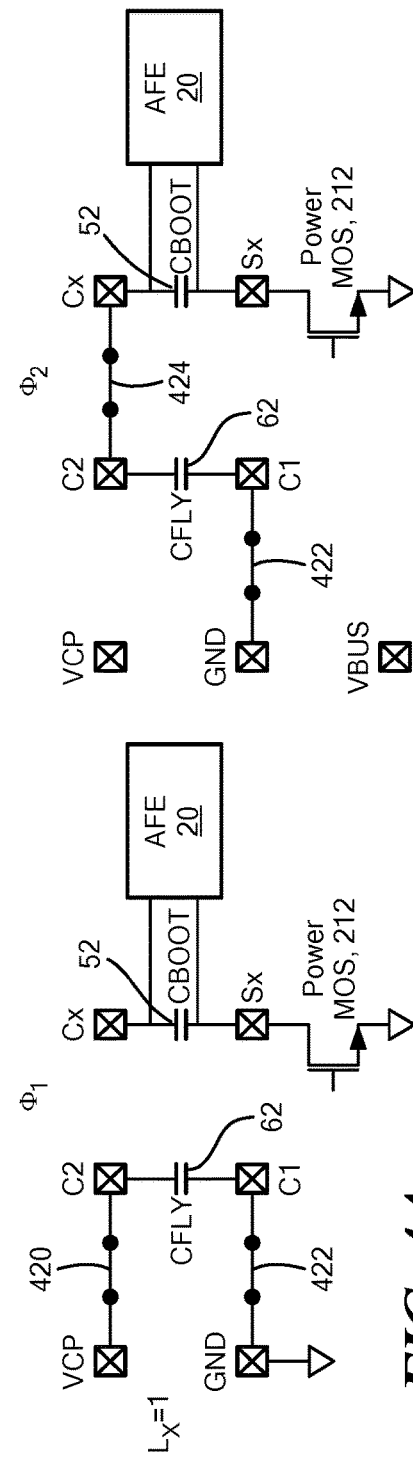
FIG. 4A shows a portion of the current sensor of FIG. 1 when the Lx control signal is high during first and second clock phases.
Figure 4B:
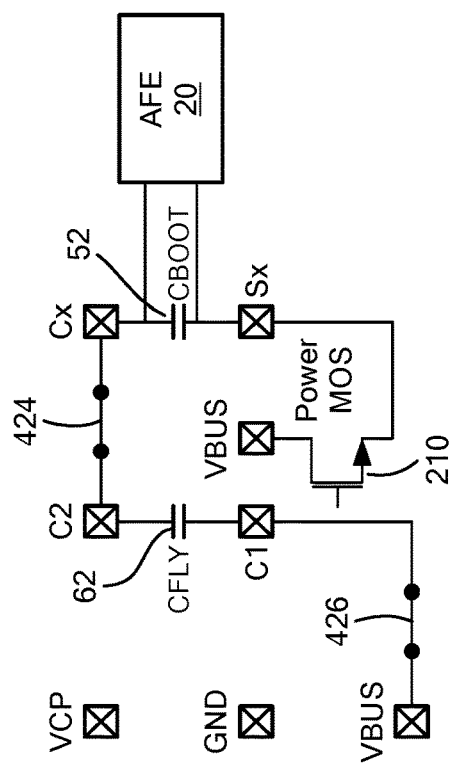
FIG. 4B shows a portion of the current sensor of FIG. 1 when the Hx control signal is high during first and second clock phases.
Figure 4B:
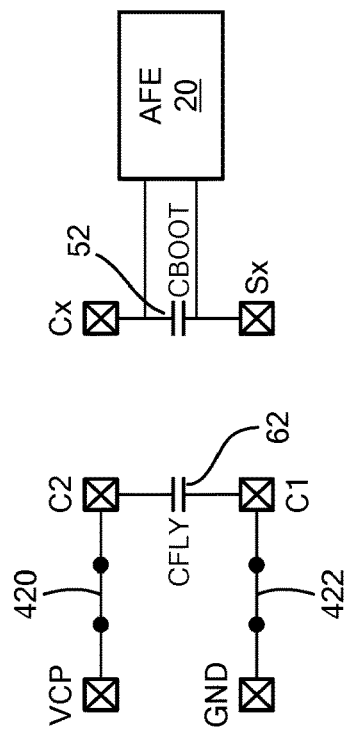
Figure 4C:
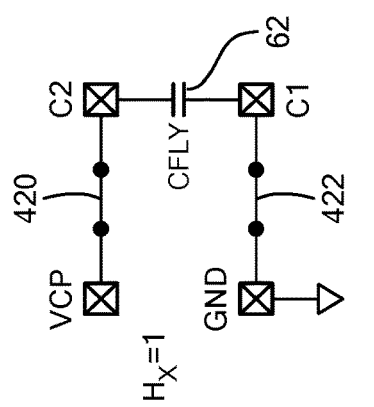
FIG. 4C shows a portion of the current sensor of FIG. 1 when both the Lx and the Hx control signals are low during first and second clock phases.
Figure 4C:
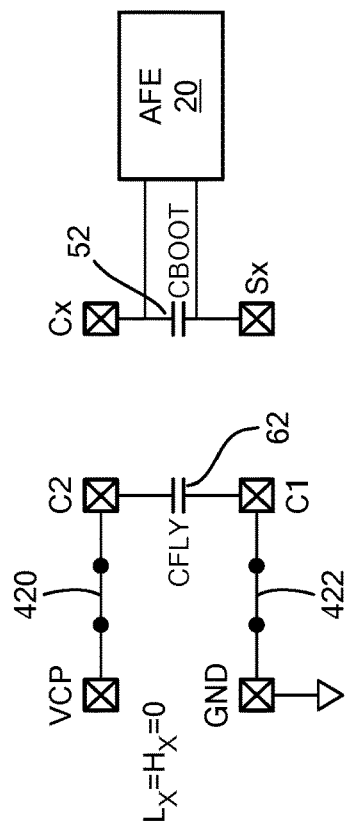

Charging of the boot capacitor 52 can be achieved in three example time periods or charging modes of operation of the charging circuit 50 (here labelled modes 4A, 4B, 4C to reflect that they correspond to the configurations shown in FIGS. 4A, 4B, 4C, respectively) under the control of motor driver control signals Hx 70, Lx 72. Thus, each of FIGS. 4A-4C corresponds to a different mode of the charging circuit 50 and thus, a different corresponding configuration of the switches of the charging circuit 50. As will be apparent, only the closed switches are shown the various views of FIGS. 4A-4C for simplicity of illustration. The left side of each such FIG. 4A-4C corresponds to a first clock phase $\Phi_1$ (i.e., a first portion of a clock cycle) and the right side corresponds to a second clock phase $\Phi_2$ (i.e., a second, different portion of the clock cycle). Clock phases $\Phi_1$ and $\Phi_2$ are non-overlapping, with a dead time to account for delay mismatch.

The charging mode of FIG. 4A corresponds to a time when the Hx control signal 70 is at a logic low level and the Lx control signal 72 is at a logic high level and thus, when the low side driver switch (e.g., switch 212 of FIG. 2) couples the sense resistor 12a to ground (e.g., to ground connection 218 in the context of FIG. 2). Thus, mode 4A can be referred to as low-side charging. During the first clock phase $\Phi_1$ of charging mode 4A (shown on the left side of FIG. 4A), the charging circuit 50 is configured to couple a first terminal of the fly capacitor CFLY 62 to the charge pump voltage VCP and a second terminal of the fly capacitor 62 to ground through closed switches 420, 422, respectively. Also during this first clock phase $\Phi_1$ of the FIG. 4A charging mode, the boot capacitor 52 is coupled to provide the analog front end 20 with the bias voltage F_VTUB 42 referenced to the common mode voltage F_VNEG 44 at connection Sx, as shown. In this configuration, the fly capacitor 62 is charged by VCP and the boot capacitor 52 powers the analog front end 20.

Referring to the second clock phase $\Phi_2$ of charging mode 4A (shown on the right side of FIG. 4A), the charging circuit 50 is now configured to decouple a first terminal of the fly capacitor 62 from the VCP voltage (e.g., by opening switch 420) and instead to couple the first terminal of the fly capacitor 62 to the boot capacitor 52 with a closed switch 424. The second terminal of the fly capacitor 62 remains coupled to ground through switch 422. During this second clock phase $\Phi_2$ of the FIG. 4A charging mode, the boot capacitor 52 remains coupled to provide the analog front end 20 with the bias voltage F_VTUB 42 referenced to the common mode voltage F_VNEG 44 at connection Sx, as shown. In this configuration, the charge on the fly capacitor 62 is transferred to the boot capacitor 52 to refresh the boot capacitor charge and the analog front end 20 remains powered by the boot capacitor 52, as shown.

The charging mode of FIG. 4B corresponds to a time when the Hx control signal 70 is at a high level and the Lx control signal 72 is at a logic low level, and thus, when the high side driver switch (e.g., switch 210 of FIG. 2) couples the sense resistor 12a to the bus voltage VBUS (e.g., to connection 216 in the context of FIG. 2). Thus, mode 4B can be referred to as high-side charging. During the first clock phase $\Phi_1$ of the charging mode of FIG. 4B (shown on the left side of FIG. 4B), the charging circuit 50 is configured to couple a first terminal of the fly capacitor 62 to the VCP voltage and a second terminal of the fly capacitor 62 to ground through switches 420, 422, respectively. Also during this first clock phase $\Phi_1$ of the FIG. 4B charging mode, the boot capacitor 52 is coupled to provide the analog front end 20 with the bias voltage F_VTUB 42 referenced to the common mode voltage F_VNEG 44 at connection Sx, as shown. In this configuration, the fly capacitor 62 is charged by VCP and the boot capacitor 52 powers the analog front end 20.

Referring to the second clock phase $\Phi_2$ of the 4B charging mode (shown on the right side of FIG. 4B), the charging circuit 50 is now configured to decouple the first terminal of the fly capacitor 62 from VCP (e.g., by opening switch 420) and instead to couple the first terminal of the fly capacitor 62 to the boot capacitor 52 with a closed switch 424. The charging circuit 50 is further configured to couple the second terminal of the fly capacitor 62 to the bus voltage VBUS (e.g., connection 64 of FIG. 1 or 216 of FIG. 2) through a closed switch 426. During this second clock phase $\Phi_2$ of the FIG. 4B charging mode, the boot capacitor 52 remains coupled to provide the analog front end 20 with the bias voltage F_VTUB 42 referenced to the common mode voltage F_VNEG 44 at connection Sx, as shown. In this configuration, the charge on the fly capacitor 62 is transferred to the boot capacitor 52 to refresh the boot capacitor charge and the analog front end 20 remains powered by the boot capacitor 52, as shown.

As shown in FIG. 4, a third mode of the charging circuit 50, charging mode 4C, occurs between modes 4A and 4B. Mode 4C can be considered a "standby" mode in which the fly capacitor 62 is not coupled to the boot capacitor 52 to refresh its charge. The purpose of this standby mode 4C is to ensure that during transitions of the motor driver switches 210, 212 (FIG. 2), when Sx is transitioning between at least ground and VBUS or vice versa, the fly capacitor 62 is not coupled to the boot capacitor 52 as is desirable to prevent unknown charging/discharging since the boot capacitor voltage is unknown during this transition time. The omission of a connection from Sx to either VBUS or to ground in FIG. 4C is intended to illustrate that this mode 4C occurs during times of transition between such connections.

More particularly, during the first clock phase $\Phi_1$ of standby mode FIG. 4C (shown on the left side of FIG. 4C), the charging circuit 50 is configured to couple a first terminal of the fly capacitor 62 to the VCP voltage and a second terminal of the fly capacitor 62 to ground in order to thereby charge the fly capacitor. Also during this first clock phase $\Phi_1$ of mode 4C, the boot capacitor 52 is coupled to provide the analog front end 20 with the bias voltage F_VTUB 42 referenced to the common mode voltage F_VNEG 44 at connection Sx, as shown, and is decoupled from the motor driver switches (both the high and low side switches 210, 212, respectively). In this configuration, the fly capacitor 62 is charged by VCP and the boot capacitor 52 powers the analog front end 20.

The second clock phase $\Phi_2$ of mode 4C (shown on the right side of FIG. 4C), is identical to the first clock phase $\Phi_1$ of mode 4C. Thus, the charging circuit 50 remains configured to couple the fly capacitor 62 between VCP and ground 66. Also, the boot capacitor 52 is coupled to provide the analog front end 20 with the bias voltage F_VTUB 42 referenced to the common mode voltage F_VNEG 44 at connection Sx, as shown, and is decoupled from the motor driver switches (both the high and low side switches 210, 212, respectively).

Considering FIG. 4C in connection with FIG. 4, the standby mode includes dead time 404 and a blanking time 408a, 408b. More particularly, when the motor control signal Lx 72 goes low at time t0, mode 4C commences with dead time 404. Once dead time 404 has lapsed at a time labeled t1 with the motor control signal Hx being driven high, a blanking time 408a commences to account for the delay required for the motor driver to drive Sx to its final value. This "blanking time" delay can programmable, including user programmable such as via EEPROM, to permit flexible implementation of the motor driver.

After the blanking time 408a, at a time t2, Sx will have been driven high and it is considered safe to charge the boot capacitor 52 in mode 4B as illustrated by the high-side charging on the right of FIG. 4B.

The standby mode 4C is repeated at the negative transition of Sx. At a time labeled t3, control signal Hx 70 goes low to initiate mode 4C with dead time 404. After the dead time 404 at a time t4, control signal Lx 72 goes high to commence blanking time 408b (which can be the same as or different from the rising edge blanking time 408a). Mode 4A is entered after the blanking time 408b elapses at a time t5 at which point Sx will have been driven low and it is considered safe to charge the boot capacitor 52 as illustrated on the right side of FIG. 4A (low-side charging).

It will be appreciated that it is desirable that the standby mode 4C not be any longer than necessary since during this time, the boot capacitor 52 is powering the analog front end 20 without being refreshed. For example, the Sx signal could have a period on the order of 100 µs with a duty cycle ranging from 10% to 90%. The blanking period (mode 4C) can typically last a couple of microseconds.

As will be apparent to those of ordinary skill in the art, with the charging arrangement of FIGS. 4-4C, the boot capacitor 52 is charged in a manner that leverages knowledge of the motor driver connections and thus of the common mode voltage associated with the sensed resistor 12a. With this arrangement of controlling the charging circuit switches based on an indicator of the common mode voltage, the AFE circuitry is properly powered over the entire common mode range.

Referring to FIG. 5 (in which like reference characters refer to like elements of FIG. 1) and according to a further aspect of the disclosure, in connection with a further current sensor IC 500, the analog front end 520 and the tub in which it is formed may be biased to different bias voltages. In particular, in the current sensor IC 500, the analog front end 520 can be biased to a first bias voltage F_VCC 514 that is a first predetermined offset voltage greater than the common mode voltage associated with the resistor 12a (as seen at IC connection Sx) and the tub 318 (FIG. 3) can be biased to a second bias voltage F_VTUB 510 that is a second, different predetermined offset voltage greater than the common mode voltage associated with the resistor (as seen at IC connection Sx).

Elements of the analog front end 520 can include regulator 522 (that can be the same as or similar to regulator 22 of FIG. 1 except for its supply voltage being F_VCC 514 rather than F_VTUB 510) and signal path 532 (that can be the same as or similar to signal path 32 of FIG. 1. Thus, signal path 532 can include amplifier 524, ADC 528, isolators 530 including output isolator 530a and input isolator 530b, clock circuit 580 and registers 582, which elements can be the same as or similar to amplifier 24, ADC 28, isolators 30 including output isolator 30a and input isolator 30b, clock circuit 80 and registers 82 of FIG. 1, respectively.

Generation of the first bias voltage F_VCC 514 can be achieved with a VREG charging circuit 572, a fly capacitor CFLY 562, a VREG charge pump 574, and a charge pump capacitor CPUMP 570, which operate to develop the first bias voltage F_VCC 514 across a first boot capacitor CBOOT1 518, as will be explained. Thus, the first boot capacitor CBOOT1 518 is coupled to the analog front end 520 and more particularly to the regulator 522, as shown. Generation of the second bias voltage F_VTUB 510 can be achieved with a VTUB charging circuit 576 and a VTUB charge pump 578, which operate to develop the second bias voltage F_VTUB 510 across a second boot capacitor CBOOT2 516, as will be explained. Thus, the second boot capacitor CBOOT2 516 is coupled to the tub 318 (FIG. 6) to provide the voltage isolation between the tub and substrate.

In embodiments, the first bias voltage F_VCC 514 is selected to ensure that the regulator 522 is supplied with a voltage and current sufficient to permit regulated voltage F_VREG 526 to be reliably generated for powering the analog front end circuitry and the second bias voltage F_VTUB 510 is selected to ensure that the junction 320 (FIG. 3) between the tub 318 and the substrate 316 does not become forward biased. In general, the first bias voltage F_VCC 514 can provide a higher current and lower voltage bias than the second bias voltage F_VTUB 510 and in one particular example, the first bias voltage F_VCC 514 can be on the order of +5V referenced to the common mode resistor voltage and the second bias voltage F_VTUB 510 can be on the order of +16V referenced to the common mode resistor voltage.

Figure 6:
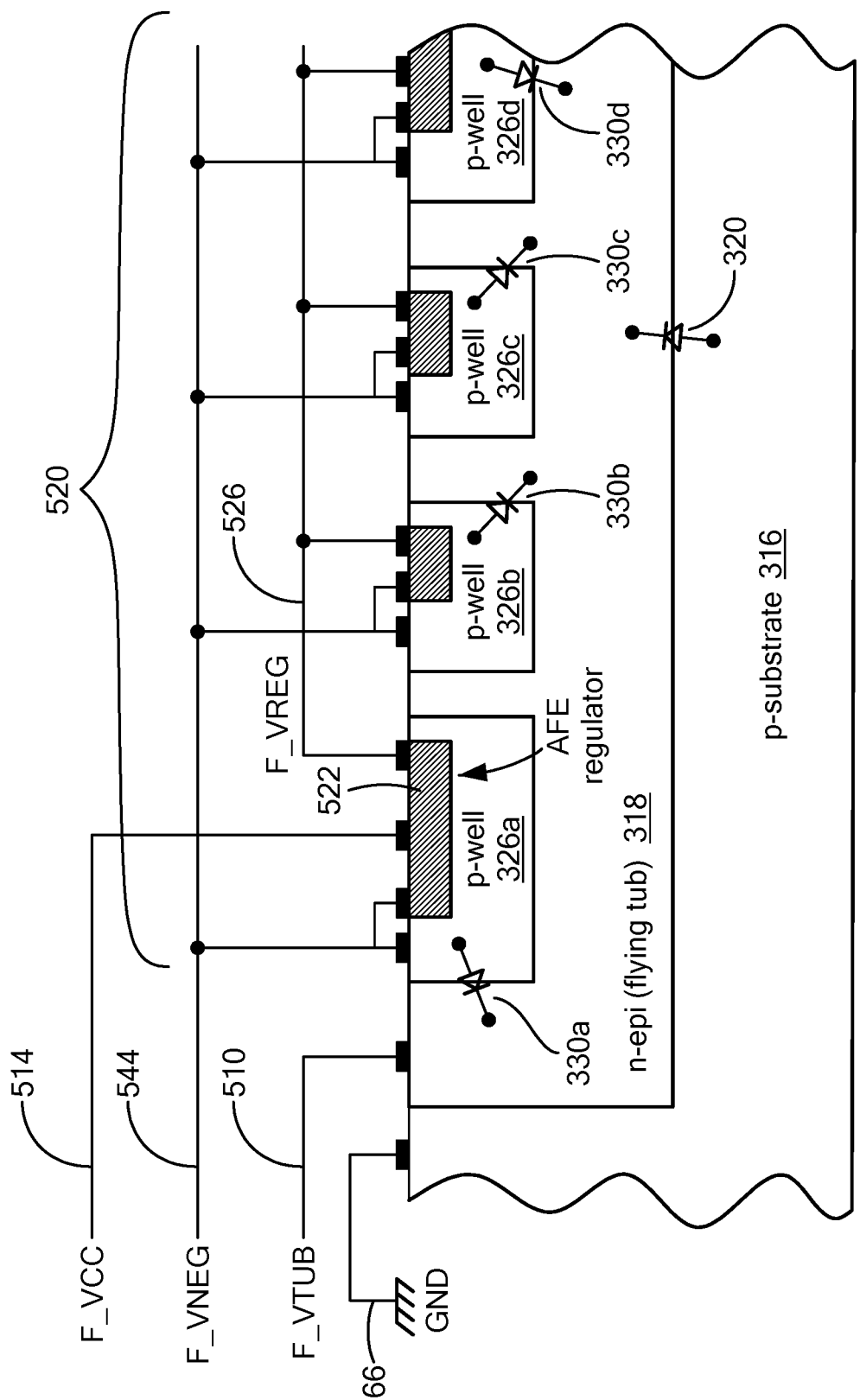
FIG. 6 is a simplified cross-sectional view of the current sensor of FIG. 5.

Referring also to the cross-sectional view of current sensor 500 in FIG. 6, it can be seen that the first bias voltage F_VCC 514 is coupled to the analog front end regulator 522 and the second bias voltage F_VTUB 510 is coupled to the tub 318. This arrangement is in contrast to the current sensor IC of FIG. 1 (as may be referred to as a single bias implementation) in which F_VTUB provides a single bias to both regulator 22 and to the tub 318. In this embodiment, analog front end circuitry within the tub 318 (other than the regulator 522) can be powered by the first bias voltage F_VCC 514 or by the regulated voltage F_VREG 526 as is illustrated. In one particular example, the F_VCC bias voltage 514 can be on the order of 5V and the regulated voltage F_VREG 526 can be on the order of 3.3V.

With this biasing arrangement (as in the case of the biasing of current sensor 10 as shown in FIG. 1), the forward biasing of the junction 320 between the tub 318 and the substrate 316 is prevented as is desirable to protect low voltage circuitry from the high voltages of the flying tub 318. Also, forward biasing of the junctions 330a-330d between the p-well regions 326a-326d and the tub 318 is likewise prevented as is desirable to protect low voltage circuitry from the high voltages of the flying tub 318.

By separating the bias voltages to the analog front end 520 and to the tub 318 in the current sensor IC 500 of FIG. 5, power consumption can be reduced. This is because the analog front end regulator 522 and other circuitry can operate with much lower voltage than is necessary to bias the tub 318 to prevent forward biasing of the junction 320. Separating the bias into a higher voltage tub bias F_VTUB 510 and a lower bias F_VCC 514 allows for lower power dissipation. The tub bias F_VTUB 510 draws very little current, so power dissipation is not a concern with this bias signal.

A further advantage to separating the bias voltages to the analog front end 520 and to the tub 318 in the current sensor IC 500 of FIG. 5 is reduced noise presented to the regulator input at F_VCC 514 and thus also reduced noise on the regulated output F_VREG 526. The isolation tub 318 presents a relatively large capacitive load on the tub bias voltage F_VTUB 510, driven by boot capacitor CBOOT2 516. This capacitance, on the order of 50-100 pF, is formed by the inherent reverse-biased diode capacitance between the isolation tub 318 and the substrate 316. As the common mode voltage experiences rapid changes in voltage (fast transitions on connection Sx), this large capacitance demands large current from the boot capacitor 516, resulting in sharp drops in boot capacitor voltage F_VTUB 510. If this bias voltage F_VTUB 510 powered the regulator 522, then these sharp drops in voltage could be seen at the input of the regulator and could partially or completely pass through to the regulator output. Separating the two bias voltages removes these sharp voltage drops from the regulator input signal and consequently, less power-supply noise is seen by all analog front end circuitry.

Referring again to FIG. 5 and the example manner in which the first and second bias voltages are generated, consider first generating the first bias voltage F_VCC 514. The VREG charging circuit 572 has as its input supply a charge pump voltage provided by VREG charge pump 574. In an example embodiment, the charge pump 574 and CPUMP capacitor 570 operate to increase the VCC voltage 568 (e.g., 5V) to a slightly higher voltage level (e.g., 6.5V) as may be necessary to ensure that the regulator 522 can power analog front end circuitry at start up of the IC 500. The VREG charging circuit 572 can include switches that are selectively opened and closed under the control of control signals Hx 70, Lx 72 in order to charge the fly capacitor CFLY 562 and transfer the charge to the first boot capacitor CBOOT1 518 in the same general manner as explained above in connection with FIGS. 4-4C.

Now considering generating the second bias voltage F_VTUB 510, VTUB charge pump 578 increases the VCC voltage 568 to supply a charge pump voltage to the VTUB charging circuit 576. In the case of the VTUB charge pump 578, there is no separate (e.g., external) capacitor shown as the charge pump capacitor may be internal to the IC 500 in some embodiments. The VREG charge pump 574 is shown coupled an external capacitor CPUMP 570 because of the higher current demand for the first bias voltage F_VCC.

The VTUB charging circuit 576 can include switches that are selectively opened and closed under the control of control signals Hx 70, Lx 72 in order to charge a fly capacitor (not shown, but in the illustrated embodiment such fly capacitor is internal to the charging circuit 576) and transfer the charge to the second boot capacitor CBOOT2 516 in the same general manner as explained above in connection with FIGS. 4-4C.

Having described preferred embodiments, it will now become apparent to one of ordinary skill in the art that other embodiments incorporating their concepts may be used. For example, it will be appreciated that components described in connection with the current sensor IC 10 (FIG. 1) and 500 (FIG. 5) can in some instances be external to the IC including, but not limited to the fly capacitors, boot capacitors, charging circuit, charging control circuit, and charge pumps. It will also be appreciated that various circuitry and techniques are possible for generating the described bias voltages, including circuitry external to the IC.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

All references cited herein are hereby incorporated herein by reference in their entirety.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A current sensor integrated circuit to sense a current through a resistor, comprising:
   a substrate;
   a tub disposed in the substrate;
   an analog front end disposed in the tub and comprising an amplifier having inputs coupled across the resistor; and
   a charging circuit configured to bias the analog front end and the tub to a bias voltage that is a predetermined offset voltage greater than a common mode voltage associated with the resistor.

2. The current sensor integrated circuit of claim 1, wherein the common mode voltage associated with the resistor is coupled to the analog front end and to the tub as a reference potential.

3. The current sensor integrated circuit of claim 1, wherein the analog front end further comprises a regulator configured to power the amplifier and coupled to receive the bias voltage as a regulator supply input voltage.

4. The current sensor integrated circuit of claim 3, further comprising a boot capacitor having a first terminal coupled to the charging circuit and to the regulator to provide the regulator positive supply voltage input and a second terminal coupled to the regulator to provide a negative supply voltage input to the regulator.

5. The current sensor integrated circuit of claim 4, wherein the charging circuit comprises a plurality of switches configured to selectively couple a fly capacitor to a charge pump voltage during a first clock phase and to decouple the fly capacitor from the charge pump voltage and couple the fly capacitor to the boot capacitor during a second clock phase.

6. The current sensor integrated circuit of claim 1, wherein the predetermined offset voltage is selected to prevent forward biasing of a junction between the tub and the substrate.

7. The current sensor integrated circuit of claim 1, wherein the charging circuit comprises:
   a first charging circuit portion configured to bias the analog front end to a first bias voltage that is a first predetermined offset voltage greater than the common mode voltage associated with the resistor; and
   a second charging circuit portion configured to bias the tub to a second bias voltage that is a second predetermined offset voltage greater than the common mode voltage associated with the resistor, wherein the second predetermined offset voltage is different than the first predetermined offset voltage.

8. The current sensor integrated circuit of claim 7, wherein the second predetermined offset voltage is selected to prevent forward biasing of a junction between the tub and the substrate.

9. The current sensor integrated circuit of claim 7, further comprising a tub boot capacitor having a first terminal coupled to the second charging circuit portion and to the tub and a second terminal coupled to a p-well region disposed in the tub.

10. The current sensor integrated circuit of claim 9, wherein the second charging circuit portion comprises a plurality of switches configured to selectively couple a fly capacitor to a charge pump voltage during a first clock phase and to decouple the fly capacitor from the charge pump voltage and couple the fly capacitor to the tub boot capacitor during a second clock phase.

11. The current sensor integrated circuit of claim 1, wherein the substrate is a semiconductor substrate comprised of a p-type material and the tub is an epitaxial tub comprised of an n-type material.

12. The current sensor integrated circuit of claim 1, wherein the analog front end further comprises an analog-to-digital converter coupled to an output of the amplifier to generate a digital signal having a value indicative of the current through the resistor.

13. The current sensor integrated circuit of claim 12, further comprising an output isolator coupled between the analog-to-digital converter and a digital processor, wherein the digital processor is configured to generate a sensor output signal indicative of the current through the resistor.

14. The current sensor integrated circuit of claim 13, further comprising an input isolator coupled between the digital processor and the analog front end and configured to transmit a clock signal from the digital processor to the analog front end for synchronization and use by the analog-to-digital converter.

15. A method of sensing a current through a resistor with a current sensor integrated circuit, comprising:
   providing a substrate;
   forming an analog front end of the current sensor in a tub disposed in the substrate, wherein the analog front end comprises an amplifier;
   amplifying, with the amplifier, a differential voltage across the resistor; and
   biasing the analog front end and the tub to a bias voltage that is a predetermined offset voltage greater than a common mode voltage associated with the resistor.

16. The method of claim 15, wherein forming the analog front end comprises providing a regulator coupled to receive the bias voltage as a supply input voltage.

17. The method of claim 15, wherein biasing the analog front end comprises charging a fly capacitor to a charge pump voltage during a first clock phase and decoupling the fly capacitor from the charge pump voltage and coupling the fly capacitor to a boot capacitor coupled to the analog front end and the tub during a second clock phase.

18. The method of claim 15, wherein biasing the analog front end and the tub comprises:
   biasing the analog front end to a first bias voltage that is a first predetermined offset voltage greater than the common mode voltage associated with the resistor; and
   biasing the tub to a second bias voltage that is a second predetermined offset voltage greater than the common mode voltage associated with the resistor, wherein the second predetermined offset voltage is different than the first predetermined offset voltage.

19. The method of claim 18, wherein the second predetermined offset voltage is selected to prevent forward biasing of a junction between the tub and the substrate.

20. The method of claim 18, wherein biasing the tub comprises charging a fly capacitor to a charge pump voltage during a first clock phase and decoupling the fly capacitor from the charge pump voltage and coupling the fly capacitor to a tub boot capacitor coupled to the tub during a second clock phase.

21. A current sensor integrated circuit to sense a current through a resistor, comprising:
   a substrate;
   a tub disposed in the substrate;
   an analog front end disposed in the tub and comprising an amplifier having inputs coupled across the resistor; and
   means for biasing the analog front end and the tub to a bias voltage that is a predetermined offset voltage greater than a common mode voltage associated with the resistor.

22. The current sensor integrated circuit of claim 21, wherein the biasing means comprises:
   first biasing means for biasing the analog front end to a first bias voltage that is a first predetermined offset voltage greater than the common mode voltage associated with the resistor; and
   second biasing means for biasing the tub to a second bias voltage that is a second predetermined offset voltage greater than the common mode voltage associated with the resistor, wherein the second predetermined offset voltage is different than the first predetermined offset voltage.

* * * * *

UNITED STATES PATENT AND TRADEMARK OFFICE
CERTIFICATE OF CORRECTION

PATENT NO. : 11,303,257 B2
APPLICATION NO. : 16/365855
DATED : April 12, 2022
INVENTOR(S) : Steven Daubert et al.

It is certified that error appears in the above-identified patent and that said Letters Patent is hereby corrected as shown below:

In the Specification

Column 4, Line 39 delete "VC format," and replace with --$I^2C$ format,--.

Column 10, Line 28 delete "can programmable," and replace with --can be programmable,--.

Column 12, Line 61 delete "coupled an" and replace with --coupled to an--.

Signed and Sealed this
Fourteenth Day of November, 2023

Katherine Kelly Vidal
*Director of the United States Patent and Trademark Office*